(12) United States Patent
Liu

(10) Patent No.: US 7,897,953 B2
(45) Date of Patent: Mar. 1, 2011

(54) MULTI-LEVEL PROGRAMMABLE PCRAM MEMORY

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 12/014,854

(22) Filed: Jan. 16, 2008

(65) Prior Publication Data
US 2009/0180314 A1 Jul. 16, 2009

(51) Int. Cl.
*H01L 21/00* (2006.01)
*G11C 11/00* (2006.01)

(52) U.S. Cl. .............. 257/2; 257/3; 257/4; 257/5; 257/E47.001; 365/148

(58) Field of Classification Search ............ 257/2–5; 365/148, 163
See application file for complete search history.

(56) References Cited

U.S. PATENT DOCUMENTS

2005/0112896 A1* 5/2005 Hamann et al. .......... 438/694

2007/0215853 A1* 9/2007 Park et al. ................. 257/4

OTHER PUBLICATIONS

Chong, Tow Chong, et al., "Superlattice-like Structure Phase Change Materials for Data Storage", *Data Storage Institute, DSI Building, 5 Engineering Drive 1*, Singapore, (Apr. 1, 2002), 7 pgs.

* cited by examiner

*Primary Examiner*—Sue Purvis
*Assistant Examiner*—Selim Ahmed
(74) *Attorney, Agent, or Firm*—Schwegman, Lundberg & Woessner, P.A.

(57) ABSTRACT

A series of phase change material layers sandwiched between a bottom electrode and a top electrode may have different phase change temperatures selected to provide a memory device having three or more discrete resistance levels, and thus three or more discrete logic levels. The non-volatile memory device may be formed with diodes providing the thermal energy for the phase changes that program the device logic level. The non-volatile memory may form part of a logic device and/or a memory array device, as well as other devices and systems. The phase change material layers may be formed using physical deposition methods, chemical deposition methods, or using atomic layer deposition. Atomic layer deposition may reduce the overall device thermal exposure and provide improved layer thickness uniformity and sharp material boundaries at the interface of different phase change materials, thus providing improved resistance level accuracy.

20 Claims, 7 Drawing Sheets

MULTI-LEVEL PROGRAMMABLE PCRAM MEMORY

TECHNICAL FIELD

This disclosure relates generally to electronic and memory devices and device fabrication, including metallic layers, dielectric layers and phase change material layers. More specifically, various embodiments relate to non-volatile memory devices.

BACKGROUND

Certain non-volatile memory devices may operate by trapping charges in a dielectric interface to adjust the threshold voltage of a transistor and thus program the desired digital value of the transistor. One method of trapping charges is found in nonvolatile flash devices that use a floating gate electrode layer placed between a tunnel oxide layer and a control oxide layer to trap charges under the influence of a control gate electrode. Other non-volatile memory devices may use ferro-magnetic or ferro-electric gate materials to program a digital value of the memory device. These types of memories can be programmed to be in either a high (i.e., logic level 1) state, or a low (i.e., logic level 0) state.

Some non-volatile memory devices may have a reliability issue with controlling current carrier flow through the dielectric layers from electrode to electrode due to the very thin physical thickness of the dielectric layers desired to obtain rapid current flow at reasonable voltage levels. For example, in a floating gate memory the top and bottom surfaces of each insulator layer may be in contact with a conductive surface, since each insulator layer may be located between solid conductive electrodes such as the substrate, the floating gate, and the control gate. Thus, a defect in either insulator layer may cause a device failure in a floating gate memory device. Charge trapping type non-volatile memories, such as NROM devices, use a change in dielectric properties, such as a boundary between two different dielectric materials, to create a layer of charge carriers, typically with an oxide-nitride-oxide (ONO) arrangement of three dielectric layers. This arrangement is less sensitive to dielectric defects in one of the three dielectric layers, but may have an issue with the programming and erasing voltage levels needed to obtain reasonable read and write speeds. It may also be difficult to obtain smooth surfaces for forming the remainder of the electronic device due to the tendency of each one of the three dielectric depositions to accentuate the particles and non-uniformities of the previous layer. This may result in electric field concentration and increased time dependent dielectric breakdown of the transistor.

The above noted issue of dielectric defect levels is likely to become more difficult in the future, since the semiconductor device industry has a market driven need to continue to reduce the size of semiconductor devices such as transistors in order to obtain lower power consumption and higher performance. In general, to reduce transistor size, the thickness of the silicon dioxide ($SiO_2$) gate dielectric is reduced in proportion to the shrinkage of the gate length. For example, a metal-oxide-semiconductor field effect transistor (MOSFET) might use a 1.5 nm thick $SiO_2$ gate dielectric for a gate length of 70 nm. An industry goal is to fabricate smaller, more reliable integrated circuits (ICs) for use in products such as processor chips, mobile telephones, and memory devices such as dynamic random access memories (DRAMs) and flash non-volatile memory.

The semiconductor industry relies on the ability to reduce the dimensions of its basic devices, generally known as scaling, to increase performance, decrease power consumption and decrease product costs of, for example, the silicon based MOSFET. This device scaling includes scaling the gate dielectric down to thinner layers, which may increase the above noted dielectric quality issue. The dielectric has primarily been silicon dioxide. This is because a thermally grown amorphous $SiO_2$ layer provides an electrically and thermodynamically stable material, where the interface of the $SiO_2$ layer with underlying silicon provides a high quality interface as well as superior electrical isolation properties. A further potential issue with scaling memory transistors to lower levels may be electrical leakage due to the small gap from source to drain diffusion.

It is possible to use phase change materials as a memory device. Phase change materials have a different electrical resistance in a polycrystalline phase as compared to an electrical resistance in an amorphous phase, and such phase change materials may be changed from a crystalline state (equivalent to an on state, for example a 1 state) to an amorphous state (equivalent to an off state, for example a 0 state) by the use of diodes rather than transistors, and thus may be more scalable than present memory cells containing transistors. Such phase change memory cells are not as sensitive to scaling related problems, such as dielectric leakage and punch through leakage, as are the MOSFETs currently used in most memory devices.

The use of memory cells that may be programmed reliably to more than just a single on state and a single off state may be used to greatly reduce the number of memory cells to store a given amount of data. For example, a memory cell that could be programmed to have eight distinct levels, each representing a distinct state, would allow the number of memory cells to be reduced to one third of the number of binary memory cells of the type such as those discussed above. Thus, there may be a benefit to the industry of a method to form a non-volatile memory device that possess more programmable logic states than the above noted practice in the industry of two logic states, as may be found in binary systems, and a non-volatile memory device that may be scaled down in size without encountering the long term reliability issues found in transistor memory devices.

DETAILED DESCRIPTION

The following detailed description refers to the accompanying drawings that show, by way of illustration, specific embodiments in which the present invention may be practiced. These embodiments are described in sufficient detail to enable those skilled in the art to practice the described embodiments. Other embodiments may be utilized and structural, logical, and electrical changes may be made without departing from the present subject matter. The various embodiments are not necessarily mutually exclusive, as some embodiments can be combined with one or more other embodiments to form new embodiments.

The terms "wafer" and "substrate" as used in the following description may include any structure having an exposed surface with which to form an integrated circuit (IC) structure. The term "substrate" is understood to include semiconductor wafers. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors. The term crystalline is understood to not be limited to large single crystals having a specified crystallographic orientation, but may include polycrystalline materials having a large number of moderately sized crystals having various crystallographic orientations. The term amorphous is understood to not be limited to a solid material having a completely disordered or glassy structure, but may include materials having some crystalline order over short distances comparable to ten atomic separations.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the present invention is defined only by the appended claims, along with the full range of equivalents to which such claims are entitled.

Figure 1:
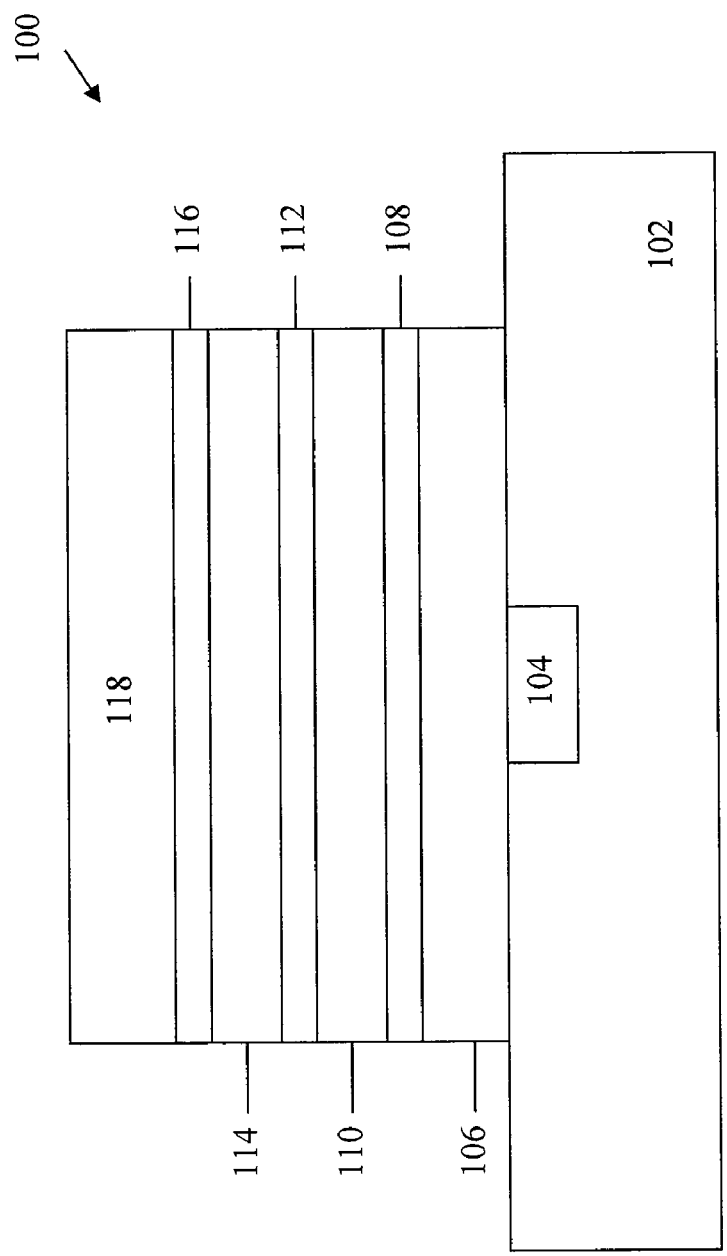
FIG. 1 illustrates an electronic device in a first programmed state, according to various embodiments.

FIG. 1 illustrates an electronic device 100 in a first programmed state which may be considered to be equivalent to a digital logic zero state. The device 100 includes a substrate 102 which may be an insulator material such as silicon oxide, silicon nitride or other insulator material on a semiconductor material such as silicon, silicon germanium or various complex materials such as gallium arsenide. The substrate has a conductive region 104, such as a diode formed in a semiconductor, or a metallic conductor, that is used as a bottom electrode. The bottom electrode 104 is shown as having a smaller surface area than the layers above, but the arrangement is not so limited, and any size bottom electrode may be used. A smaller bottom electrode, for example formed in a cylindrical or ring form, may help in concentration of the current flow and limitation of the melted area size, and thus improve the reproducibility of the multiple resistance states. Other embodiments, discussed later will illustrate a bottom electrode that is larger than the phase change region, but neither embodiment is limited to a larger or smaller bottom electrode area.

The formation of electronic devices that possess the ability to store information, such as dynamic random access memory (DRAM) and static random access memory (SRAM), typically involves the use of multiple transistors in a single cell holding a single binary bit of information and are thus relatively expensive to produce and subject to various reliability failure modes. In particular metal oxide semiconductor (MOS) transistors may have dielectric defects and time dependent dielectric breakdown, which are increasingly found in electronic devices as the size of the devices is scaled, or reduced. Flash memory devices have a number of advantages over DRAM and other memory devices in being formed with a single transistor per memory cell, and in retaining the stored information for long periods after the power is removed, in other words flash is a non-volatile memory. Flash memory devices still use transistors, have dielectric reliability issues, require higher voltages than desired, have longer programming times than desired, and can not be erased and rewritten as often as desired.

As the industry continues to scale down flash memory devices, other non-volatile memory technologies have been investigated to determine the trade off between the reliability problems incurred in scaling, the speed of operation, and the cost of fabrication. One possible direction includes the use of materials that change phase from a crystalline state to an amorphous state under the application of an electrical current, and vice versa. These materials are referred to as phase change materials. These phase change materials may be used in a phase change random access memory (PCRAM) device using either transistors or diodes, for example as the current source for triggering the material phase change. Similar materials may also be used in optical recording such as compact disks (CDs) and rewritable digital laser readable disks such as DVDs, where the difference between the more or less crystalline phase and the essentially amorphous phase includes a sharp difference in reflectivity.

Phase change materials include what may be known as the chalcogenide materials and may include various combinations of germanium, antimony, tellurium, and other similar materials. Some phase change material combinations that may be useful for memory devices include binary combinations such as germanium telluride (GeTe), indium selenide (InSe), antimony telluride (SbTe), gallium antimonide (GaSb), indium antimonide (InSb), arsenic telluride (AsTe), aluminum telluride (AlTe); ternary combinations such as germanium antimony telluride (GeSbTe), tellurium germanium arsenide (TeGeAs), indium antimony telluride (InSbTe), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe); and quaternary combinations such as tellurium germanium antimony sulfide (TeGeSbS), tellurium germanium tin oxide (TeGeSnO), and alloys of tellurium germanium tin gold, palladium tellurium germanium tin, indium selenium titanium cobalt, germanium antimony tellurium palladium, germanium antimony tellurium cobalt, antimony tellurium bismuth selenium, silver indium antimony tellurium, germanium antimony selenium tellurium, germanium tin antimony tellurium, germanium tellurium tin nickel, germanium tellurium tin palladium, germanium tellurium tin platinum. Known specific combinations include $Ge_2Sb_2Te_5$ and $Sb_2Te_3$, which have been used in forming phase change memory devices.

These phase change materials have a relatively low electrical resistance when in the crystalline (again note that polycrystalline is included) state and become much more resistive by up to three or four orders of magnitude when in the amorphous state. The crystalline or amorphous state of the material may be read by applying a small current across the material and measuring the resistance, and the logic state determined.

Each of the phase change materials has a specific melting point (Tm), and a glass transition temperature (Tg) at which the material may be internally mobile and flow and become crystalline if held above Tg for a long enough time. Phase change materials such as germanium antimony tellurium (for example, $Ge_2Sb_2Te_5$) have melting points that change as the relative composition ratios are adjusted, and also change if the material is doped, (for example, by adding nitrogen or oxygen to the material in atomic percentages of from 1 to 12 percent). Doping a phase change material may cause the Tm and Tg to increase, typically by precipitating into grain boundaries, which decreases the mobility of the phase change material atoms and thus increases the melting temperature. The dopant material is typically not lost during melting and is thus still available to maintain the increased melting temperature for many melting/crystallization cycles. To cause the phase change material to become amorphous requires a current to heat the material above the melting point Tm, typically for less than 50 nanoseconds (ns), and then allowing the material to quickly cool to below the glass transition temperature Tg, thus leaving the material in the majority of the melted region in an amorphous state and much more electrically resistive. The phase change material may become crystalline, or polycrystalline, by applying a lower current that heats the material to above Tg, but below Tm, for a time period sufficient to allow the material to crystallize, typically 50-100 ns. Reading the material state may be performed in about 50 ns by using a small current that will not allow the material to reach Tg, and measuring the resistance. Thus a single region of a phase change material may be seen to easily form a binary bit of information that should not change state when the electrical power to the device is removed, and is thus non-volatile.

It is possible to form a PCRAM cell that may have more than two logic states by changing the relative proportion of amorphous material to crystalline material. The region between a top electrode and a bottom electrode may have any portion converted to an amorphous state by proper timing of the melting current and control of the current level, and thus numerous possible combinations of crystalline and amorphous portions of the current path may result in numerous different resistance levels for the cell. However, it is very difficult to control the exact shape and thickness of the phase change material layer that is phase transformed by the programming pulse, and thus the resulting resistance states are neither reproducible from lot to lot, nor discrete enough for reliable operation. It is also difficult to control the growth of the amorphous region, and thus the amorphous region size will depend upon how long the continuous growth continued, which is dependent upon the Tm of the particular composition and the resistance heating level, e.g., temperature.

A PCRAM cell may be formed with multiple reliable discrete resistance states by forming multiple phase change material layers, each potentially having a different Tm and Tg, which would become amorphous at clearly different current and heat levels, would limit the growth of the amorphous layer to the thickness of the targeted phase change layer, and thus result in reliable and reproducible resistance levels. The illustrative examples show how to form three or four different resistance states and thus three or four bits of information, but the number of states is not so limited and it is easy to see how to increase the number of discrete resistance states to any desired number, or alternatively, to provide only a single layer with two resistance states. It is also possible to program a memory cell by use of material layers with selected different crystallization temperatures (i.e, different Tm), rather than different amorphization temperatures.

FIG. 1 illustrates six layers of phase change material 106 to 116 in a PCRAM 100, with layers 106, 110 and 114 being shown as being thicker than the remaining layers. It is also possible to insert diffusion barrier layers, such as titanium nitride, between some or all of the phase change layers, to reduce mixing of the compositions of the various phase change materials, and thus a drift in the melting point and the glass transition temperature. The embodiment is not limited to unequal thickness layers, and the layer thickness is varied in the figure solely to improve the clarity of the explanation of the actions of the layers under various current levels. Layer 106 may be a layer of an undoped phase change material such as germanium antimony tellurium (GST) in a crystalline state. As an illustrative example, $Ge_2Sb_2Te_5$ has a glass transition temperature of about 140° C. and a melting temperature of about 630° C., depending upon exact composition ratios and doping levels. Layer 108 may be a doped GST layer, either the same composition as layer 106 with a selected doping level of a dopant material such as oxygen or nitrogen, or a different ratio of materials, or a selected different combination of phase change materials. The layer 108 is selected to have a higher Tm than layer 106, such that a current level I1 that would be sufficient to melt the region of undoped GST layer 106 in the region surrounding the bottom electrode 104, but would not reach the melting point of the layer 108. This melting and rapid cooling of the region around the bottom electrode results in an amorphous region having a higher electrical resistance in layer 106.

Layer 110, which may be undoped GST, is shown above doped GST layer 108, layer 108 being shown as thinner than undoped layers 106 and 110 only for clarity. GST layer 110 may have the same composition and Tm as layer 106 for simplicity, and may have the same layer thickness. Layer 112 may be a doped GST layer having the same composition as layer 108, or having a higher Tm, and may have the same layer thickness. Layer 114 may be an undoped GST layer having the same or different composition and Tm as compared to layers 110 and 106. Layer 116 may be a doped GST layer having the same or different composition as layer 108 and 112. A top electrode 118 is located on doped GST layer 116 to provide the remainder of the current path used for melting the layers sequentially from the bottom, or for recrystallizing the GST layers, or for reading the resistance level of the electrical path formed by the bottom electrode 104, GST layers 106 to 116, and the top electrode 118. It should be noted that it is not necessary to reset the layers in sequence as discussed in this illustrative embodiment for simplicity or explanation. All of the layers may be reset to the amorphous state at the same time, or selected individual layers may be reset to the amorphous state as desired depending upon the selected value of the melting temperature and the glass transition.

Figure 2:
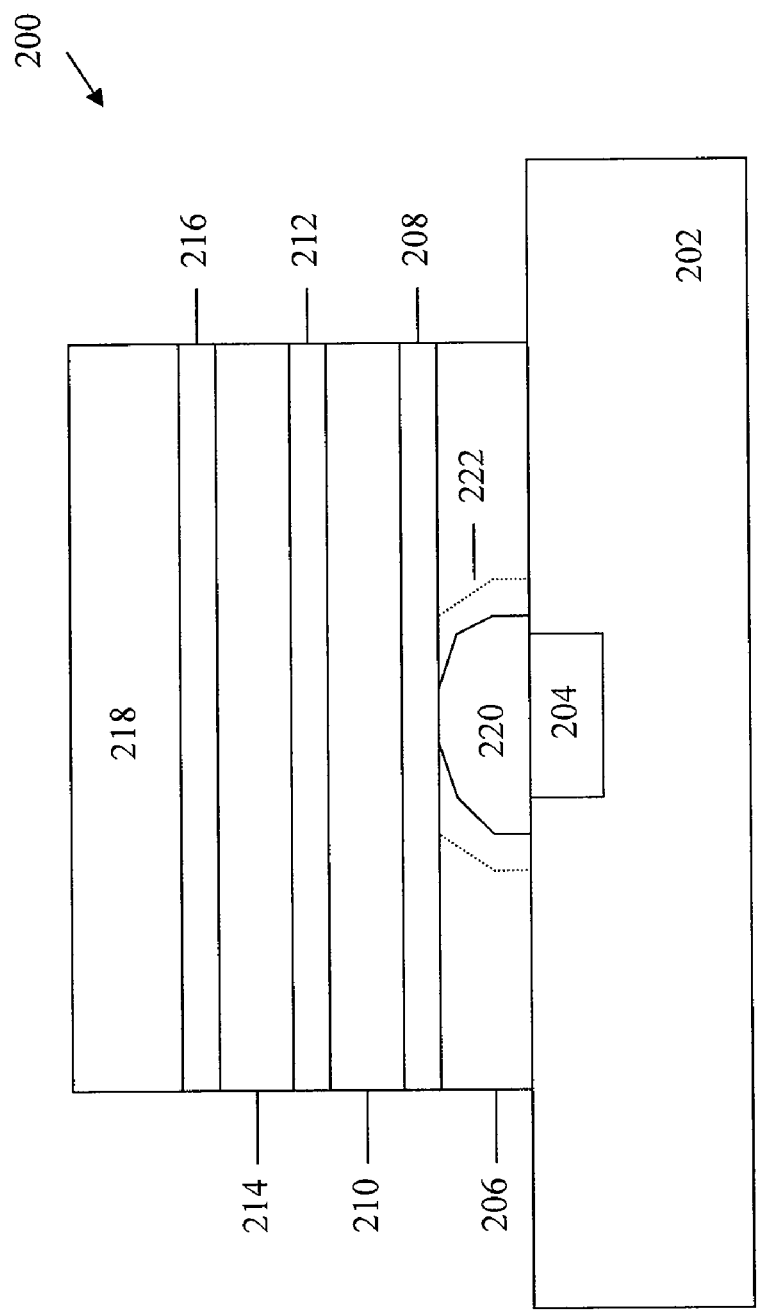
FIG. 2 illustrates the electronic device in a second programmed state, according to various embodiments.

FIG. 2 illustrates the electronic device 200 in a second programmed state, which may be viewed as being equivalent to a digital 1, where an amorphous region 220 exists in the undoped GST layer 206 between the bottom electrode 204 and the doped GST layer 208. The amorphous region increases the resistance of the PCRAM cell 200 by a discrete and reproducible amount, since increased melting temperatures and times result in the region 220 increasing in width, as shown by the dotted line region 222, but not increasing the amount of amorphous material located between the top and bottom electrodes. Thus, increased temperature or increased melting time affects the overall PCRAM cell 200 resistance by a small amount. The amorphous region 220 is programmed by application of a current I1 sufficient to exceed Tm and melt the material of layer 206, but not high enough to reach the Tm of the layer 208, which may be doped with nitrogen or oxygen and thus have a higher Tm. The more reproducible the thickness of layer 206, the more reproducible the resistance of the memory cell 200 in this second programmed state. It is possible to more tightly control the exact atomic ratio of the materials and the layer thickness by the use of atomic layer deposition (ALD), and thus more exactly determine the melting points and resistance.

Figure 3:
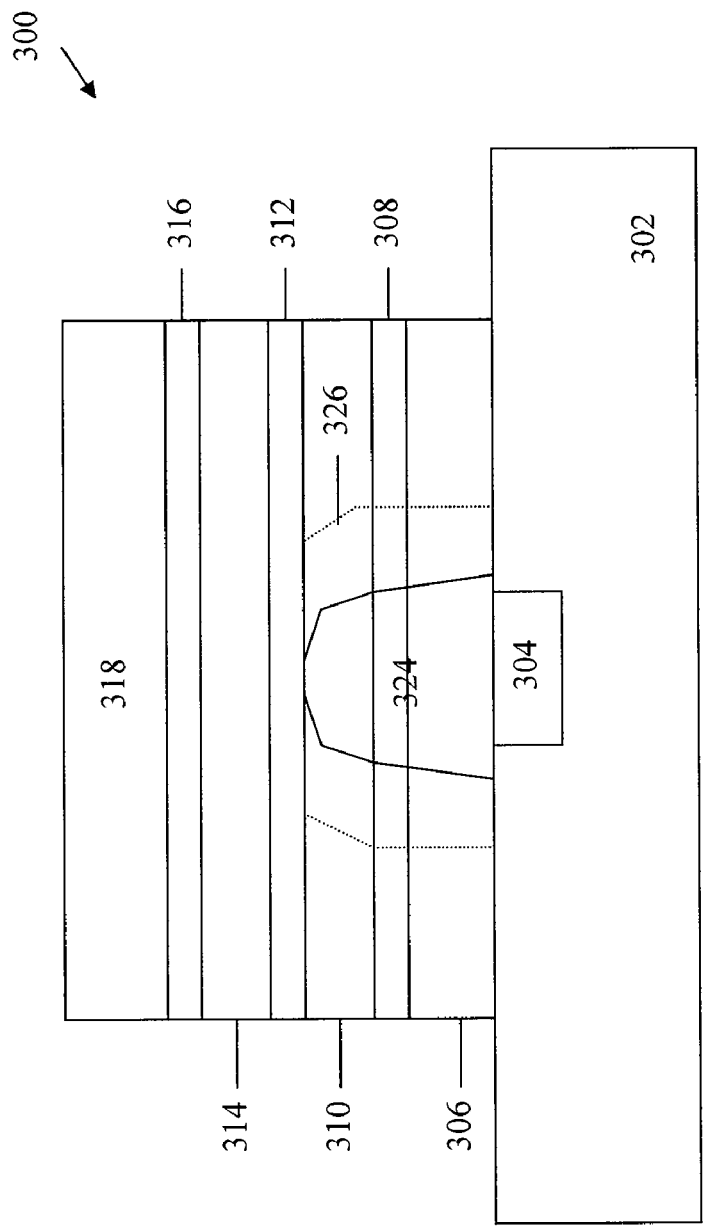
FIG. 3 illustrates the electronic device in a third programmed state, according to various embodiments.

FIG. 3 illustrates the electronic device 300 in a third programmed state, which may be viewed as being a digital 10 logic state, a state not obtainable in a single digital memory transistor. The programming current level between the bottom electrode 304 and the top electrode 318 has been increased to a level I2 which is higher than I1, and sufficient to melt doped GST layer 308 and undoped layer 310, but not sufficient to melt layer 312. The layer 312 may be formed to have a higher Tm due to increased amounts of dopant as compared to layer 308, or may have a different material composition ratio, or may have different elements forming the phase change material. It is also possible to form layer 312 with the same composition as layer 308 since the diverging current distribution decreases the amount of current heating occurring at the location of the layer 312.

In this case, the amorphous region 324 extends much further towards the top electrode 318 than amorphous region 220 of FIG. 2, and thus the direct line resistance is much higher, since the entirety of the height of layers 306, 308 and 310 are now amorphous and much more resistive than when in the polycrystalline state. This situation is now equivalent to a discrete third logic state having a carefully controllable and separable resistance value, since increasing the current or the heating time simply results in an amorphous region, denoted by region 326, which should not change the relative ratio of amorphous to crystalline material in the current path between the bottom electrode 304 and the top electrode 318 by a significant amount.

Figure 4:
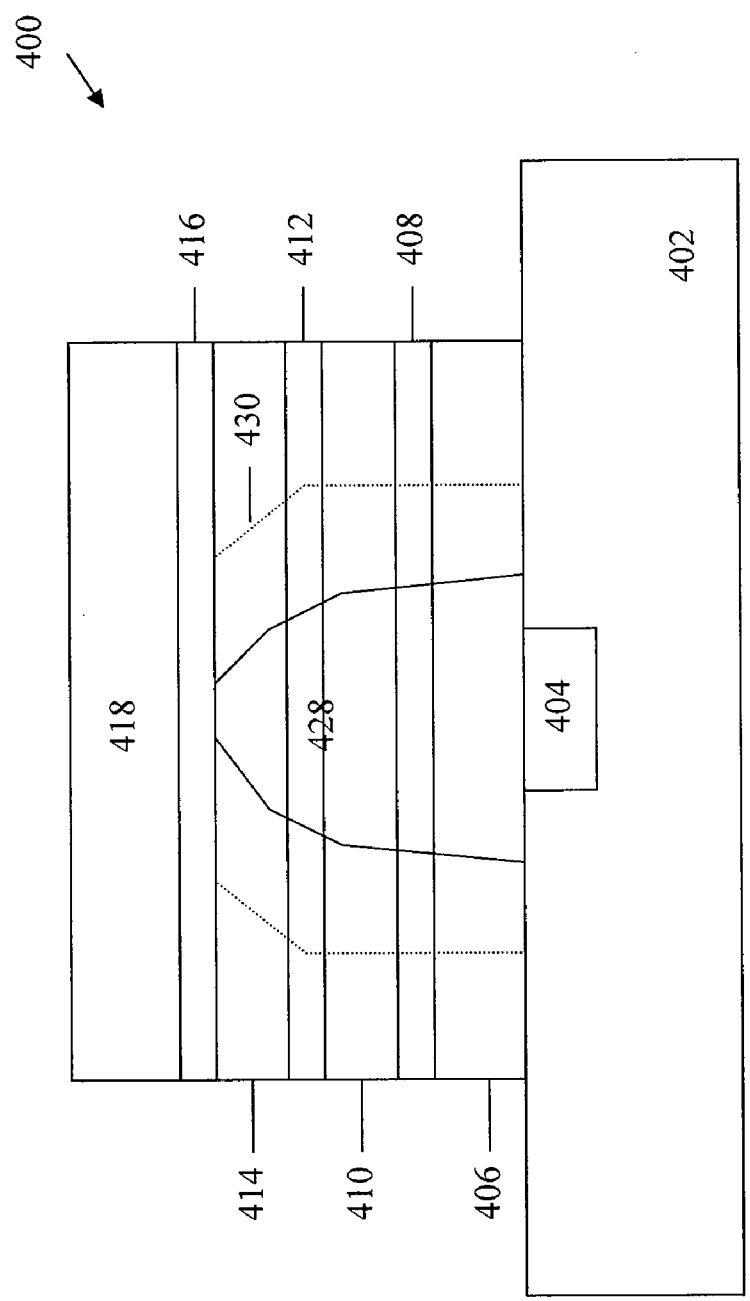
FIG. 4 illustrates the electronic device in a fourth programmed state, according to various embodiments.

FIG. 4 illustrates the electronic device 400 in a fourth programmed state, which may be viewed as being equivalent to a digital 11 logic state. The applied current from the bottom electrode 404 to the top electrode 418 is set to a level I3 that is higher than I2, and sufficient to melt layers 406, 408, 410, 412 and 414, which may be undoped GST. The level of current I3 may be large enough to also melt layer 416, which may be a doped GST or undoped GST, but the operation of the discrete resistance states of the device 400 does not require that layer 416 be amorphous. The region that exceeded Tm, melted and rapidly cooled, forms amorphous region 428 having a higher resistance than the same region in the crystalline or polycrystalline state, and having a distinctly different resistance from the amorphous states produced by the lower programming currents I2 and I1. In the case where the programming current I3 is not sufficient to melt layer 416 (which may be a doped GST layer and have a higher Tm than may be obtained with the current level I3) then increased time periods with the programming current at I3 result in the amorphous region 428 expanding laterally to form the region 430, which does not have a substantially different resistance as compared to region 428.

The electronic device, for example a PCRAM, described and shown in FIGS. 1 to 4, operates by setting the six shown phase change material layers (206-216 in FIG. 2) to a crystalline state by applying a SET current selected to exceed the Tg of all of the layers, but not high enough to reach Tm for any one of the layers. The number of phase change material layers is not limited to six, and increased numbers of layers result in an increase in the number of logic states available to a single PCRAM cell. With all six shown layers in a crystalline state, the resistance of the PCRAM cell has been set to a minimum level of about 1-10K ohms, depending upon the cross sectional area of the cell and the thickness of the layers. If the phase change material is selected to be GST, the Tm will vary from about 630° C. for the undoped layers, up to about 720° C. for more heavily doped layers. The glass transition temperature may vary from about 140° C. to above 230° C., which may allow a SET current lasting about 100 ns to be selected to provide a device temperature of from 240° C. to 600° C., to set the phase change layers to a crystalline or polycrystalline state. In the SET state, the resistance is at a low level and the logic level may be considered to be at a first state equivalent to a logic 0.

To obtain a second logic state equivalent to a logic 1, a RESET current I1 is selected to obtain the Tm (and thus melt) of the bottom GST layer 206. Increasing the current only leads to the melted region 220 expanding laterally, since the second layer 208 has a higher Tm and will not melt until the current reaches I2. The resistance of the PCRAM cell 200 remains essentially the same for all current levels between I1 and I2. Typical times for melting may be about 10 ns To obtain a third logic state equivalent to a logic 2 (or 10 in binary) a RESET current I2 is selected to reach the Tm of the second layer 308, and the third layer 310 also melts since it has been selected to have a lower Tm than the second layer 308. Increasing the current level only results in the melted region 324 expanding laterally to 326, until the current reaches I3. The resistance of PCRAM cell 300 is higher than that shown in FIG. 2 and remains essentially constant for all current levels between I2 to I3.

To obtain a fourth logic state equivalent to a logic 3 (e.g., 11 in binary) a RESET current I3 is selected to reach the Tm of the fourth layer 412, and the fifth layer 414 also melts since it was selected to have a lower melting point than layer 412. Increasing the current level above I3 results in the melted region 428 expanding laterally to 430, or until the sixth layer 416 melts. The resistance of the PCRAM cell 400 is higher than that shown in FIG. 3, and remains essentially constant for all current levels around and above I3.

The addition of additional layers of undoped GST and interleaved layers with increased Tm levels will provide additional logic states for the illustrated single PCRAM cell. It is possible to increase the Tm level by increasing the doping level of the phase change materials (for example, using either oxygen or nitrogen doping in a GST layer) or using other phase change materials having selected higher Tm levels. The described arrangement provides discrete reset resistance states for forming multi-level programming of a single memory cell, with the multi-level resistance states pre-tunable by changing the thickness of the various layers to increase the amorphous resistance without substantially changing the crystalline set resistance. The set time period of the multi-level cell may be faster than the set time of single phase change layer devices since the crystallization rate may be faster due to the presence of multiple material interfaces in all logic states to facilitate nucleation and growth. The control of the layer thickness and composition of the phase change material layers may be improved by the use of atomic layer deposition of the phase change material layers to tightly control the layer composition, smoothness and thickness. The programming current requirements may also be reduced from reduced thermal conductivity in the multilayer structure.

Figure 5:
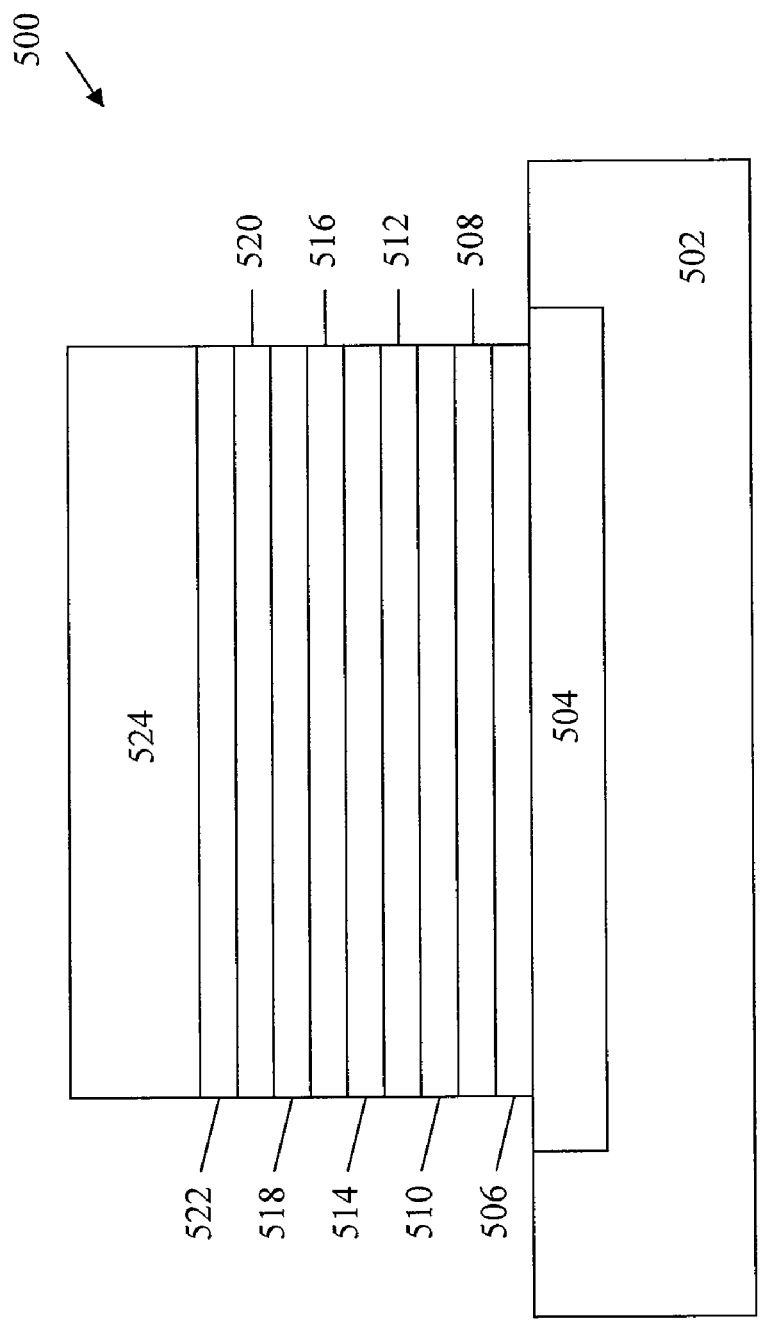
FIG. 5 illustrates an electronic device, according to various embodiments.

FIG. 5 illustrates an alternative arrangement of an electronic device 500, having a large bottom electrode 504 in a substrate 502. The bottom electrode is shown as being larger than the phase change layers located above, but the embodiment is not so limited and a smaller or an equal sized electrode will provide an operable device. In this described embodiment, the phase change occurs across the entire width of a pillar of nine stacked phase change material layers 506-522. The layers are shown as having the same thickness, but the embodiment is not so limited, and the thicknesses of the individual layers may be selected to obtain specific resistance changes between various levels.

The first phase change layer 506 may have the lowest Tm and be reset to an amorphous state by a reset current I1 for a time period of from 5-20 ns, and a current level selected to reach Tm for layer 506, but to not reach Tm for layer 508. Layer 508 may be the same basic material as layer 506, but may have a 1% doping level (for example nitrogen). In a similar fashion, each succeeding layer will have a higher Tm level, either by having increased levels of dopant or by using different phase change material combinations having different Tm levels. In this embodiment, layer 510 may have a 2% nitrogen level, layer 512 a 3% nitrogen level, layer 514 a 4% nitrogen level, layer 516 a 5% nitrogen level, layer 518 a 6% nitrogen level, layer 520 a 7% nitrogen level, and layer 522 an 8% nitrogen level. Layer 524 is a conductive material, such as a metal, forming a top electrode. Since each layer has an increased Tm, a range of reset currents I1 to I9 can be selected to melt up to any one of the nine illustrated layers. This results in ten different resistance states for the PCRAM cell 500. Increased numbers of phase change material layers will result in an increased number of cell resistance levels, and thus different discrete logic levels. It is not necessary to perform the phase changes in the sequence discussed, and any combination of layers, including all the shown layers, may be simultaneously reset to the amorphous state by the proper selection of voltage and current levels.

An illustrative operation of the memory cell 500 may begin by setting the entire stack of layers 506-522 to a crystalline state with a set current selected to exceed the Tg of all the layers 506-522, but without exceeding the Tm of any of the layers 506-522. If the layers are formed of GST, then the set current may be selected to obtain a temperature of from 240° C. to 600° C. for a time of from about 40 ns-100 ns. Programming the cell 500 logic states comprises applying an approximately 10 ns current pulse across the cell having a current level selected to melt as many of the layers 506-522 as needed to obtain the desired logic state. The present embodiment has nine layers and nine discrete resistance levels above the minimum resistance obtained with all layers in crystalline (or polycrystalline) form, to obtain ten discrete logic states 0-9. Additional logic levels may be easily obtained by increasing the number of phase change material layers. Note that an alternative method of operation may include using different set currents to crystallize selected layers while leaving the remaining layers amorphous.

It is not necessary to have the Tm level increase from the bottom layer to the top layer as described in the previous embodiment by either increasing the doping level of a single type of material, or by selecting different phase change materials. In another embodiment, layers 506 and 522 are both GST with no doping and thus having the lowest Tm level. Layers 508 and 520 have a 2% nitrogen level, layers 510 and 518 have a 4% nitrogen level, layer 512 and 516 have a 6% nitrogen level and layer 514 has an 8% nitrogen level and thus the highest Tm level. This embodiment ensures that the melting point, the crystallization temperature and resistivity all increase in a monotonically related fashion. This embodiment has greater manufacturing margin and sensitivity, but has fewer logic states than a PCRAM cell 500 formed as in the previously described embodiment having the same number of phase change layers. In another embodiment the melting point, crystallization temperature and resistivity all decrease in a monotonic related fashion towards the middle layer of the stack.

Figure 6:
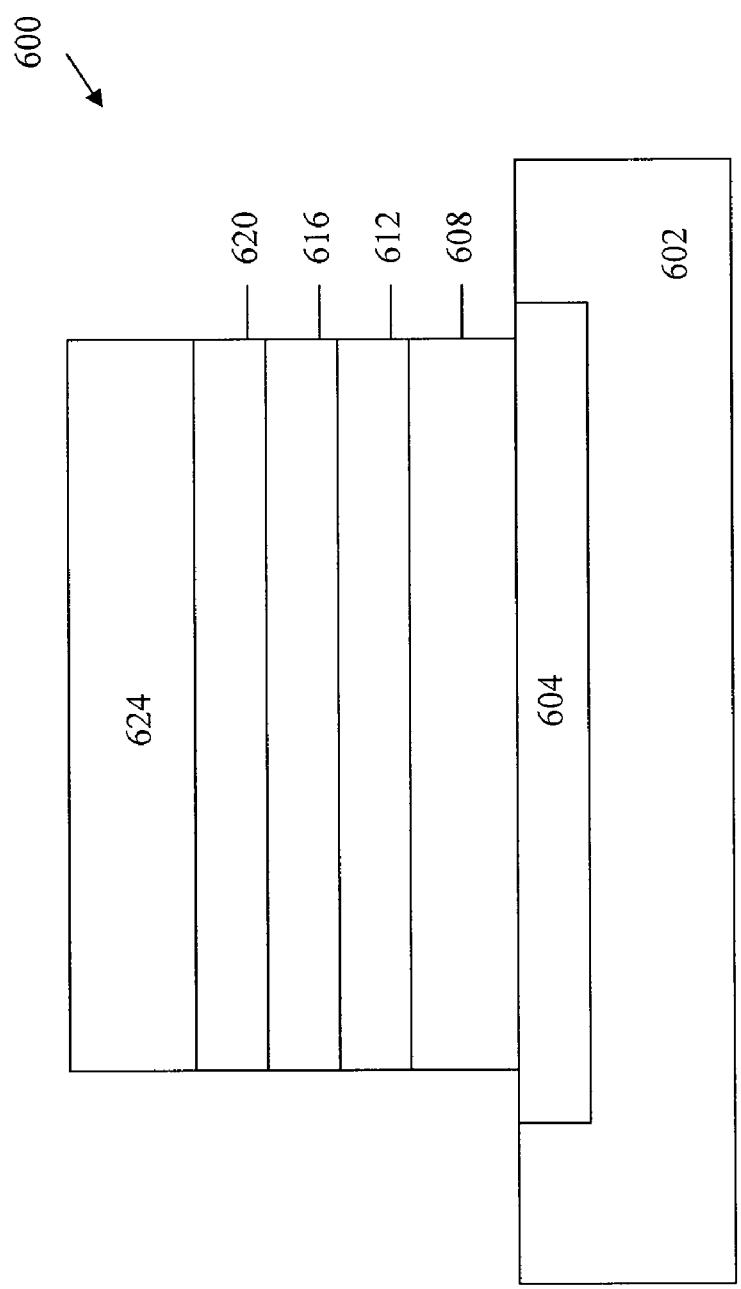
FIG. 6 illustrates an electronic device, according to various embodiments.

FIG. 6 illustrates another alternative embodiment of an electronic device 600, in which the Tm does not increase in any particular direction, but rather is placed to provide various combinations of amorphous layers for a given reset current level. A substrate 602 includes a bottom electrode 604, shown as being larger than the phase change material layers, but the embodiment is not so limited. Layer 608 of a phase change material is shown as being thicker than the other phase change material layers 612, 616 and 620, but the embodiment is not so limited, and the layer thickness may be selected to obtain a desired change in resistance between particular logic states. Above the phase change materials is a conductive top electrode 624.

In this illustrative embodiment layer 608 is selected to have a Tm1 that is higher than a Tm3 for layer 616, which is higher than a Tm2 for layer 612. Phase change layer 620 is selected to have a Tm4 that is higher than any of the other layers, and layer 612 has a Tm2 that is lower than any of the other layers. There are four phase change layers in this embodiment, but five logic states may be obtained. Additionally, many more logic states (i.e., different levels) may be obtained if the phase change layers start in the amorphous state and have selected different crystallization temperatures.

In this embodiment the arrangement of melting temperatures as discussed above may be denoted as Tm2<Tm3<Tm1<Tm4. Thus, the reset current levels may be denoted as I2<I3<I1<I4. The layers 1-4 (608-620 respectively) start in the set condition, with all layers in a crystalline state, and having a lowest resistance level, equivalent to a logic state 0. If the reset current is smaller than I2, then all layers remain crystalline and the logic state is still 0. If the reset current is larger than I2 but smaller than I3, then only the second layer (612) is switched to the amorphous state, and the overall resistance increases to a logic state 1. In the case where the reset current is set to between I3 and I1, then both the second (612) and third (616) layers become amorphous (and more resistive), and the overall cell 600 electrical resistance becomes the series combination of the two layers and represents a logic state 2. If the reset current is between I1 and I4, then the first (608), second (612) and third (616) layers are amorphous and more resistive. The cell resistance is the series resistance of the three layers and represents a logic state 3. Finally, if the reset current is larger than I4, then all four phase change layers are converted to the amorphous state and the resistance is at a maximum level, representing a logic state 4. Thus it is clear that the order of the phase change layers and the Tm of the layers may be ordered as either increasing or decreasing from the bottom layer, increasing or decreasing from the center layer outward, or in various other arrangements. Alternatively, the phase change material layers can be separated by conductive diffusion blocking layers to prevent intermixing between the adjacent phase change layers.

As noted previously, control of the various layer material composition ratios and thickness will improve the accuracy and reproducibility of the measured resistance of the PCRAM memory cells, and such improved control may be obtained by the use of atomic layer deposition (ALD) to form the layers. ALD may also provide sharper layer interface boundaries which may also improve the precision of the PCRAM memory cell. At this point, a general discussion of atomic layer deposition will be provided, since the properties obtainable from ALD processes impact the properties of the phase change material layers, the conductive layers, potential dielectric layers, and the operation of the PCRAM memory.

During a conventional deposition process, such as sputtering or chemical vapor deposition, various potential issues may arise, such as particles of the material to be deposited bombarding the surface at a high energy, causing particles or damage. When a particle hits the surface, some particles may adhere, and other particles may cause surface damage. High energy impacts may remove substrate material creating pits. The surface of such a deposited layer may have a rough contour due to the rough interface at the surface, and thus the electrical properties of a thin film may not be as ideal as the values in a bulk sample of the same material. Thus the method with which the thin film dielectric is deposited may have a substantial impact on the usefulness of the material in electronic devices. ALD may also be performed at a low enough temperature to reduce the growth of unwanted oxide on the substrate surface without the need for a barrier layer. Such an oxide layer may increase the resistance of a PCRAM.

ALD, which may also be known as atomic layer epitaxy (ALE), is a modification of chemical vapor deposition (CVD) and may also be called "alternatively pulsed-CVD", or "sequentially pulsed-CVD". In ALD, gaseous precursors are introduced one at a time to the substrate surface mounted within a reaction chamber (or reactor). This introduction of the gaseous precursors takes the form of individual pulses of each gaseous precursor. In a pulse of a precursor gas, the precursor gas is made to flow into a specific region for a short period of time. Between the pulses, the reaction chamber is purged with a gas, which in many cases is an inert gas, and may also be evacuated prior to the next step. In the first reaction step of the ALD process, the first precursor saturates and is chemisorbed (i.e., adsorbed) at the substrate surface during the first pulsing phase. Subsequent pulsing with a purging gas removes excess precursor from the reaction chamber, specifically the precursor that has not been chemisorbed.

The second pulsing phase introduces a second precursor chemical (which may also be known as a reactant) to the substrate where the growth reaction of the desired film takes place, with a reaction thickness that depends upon the amount of chemisorbed first precursor. Subsequent to the film growth reaction, reaction byproducts and precursor excess are purged from the reaction chamber. With a precursor chemistry that adsorbs and aggressively reacts on the substrate, one ALD cycle may take less than one second. Precursor pulse times range from 0.5 sec to 3 seconds. In ALD the saturation of the reaction and purging phases makes the film growth self-limiting and thus uniform. ALD provides for tightly controlling film thickness in a straightforward manner by controlling the number of growth cycles.

ALD was developed to manufacture luminescent and dielectric films for displays, such as doped zinc sulfide and alkaline earth metal sulfide films. ALD may also be used to grow epitaxial II-V and II-VI films, crystalline or amorphous dielectrics, pure metal layers, alloy metal layers such as phase change materials, and multilayer structures known as nanolaminants. Such nanolaminants may be used in a PCRAM device to form very thin layers to reduce the overall cell resistance.

The precursors used in an ALD process may be gaseous, liquid or solid; however, liquid or solid precursors should be volatile with a vapor pressure high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary during the process because of changes in solid surface area. The precursors used in ALD should be thermally stable at the substrate temperature because their decomposition would destroy the surface control and accordingly the advantages of the ALD method that relies on the reaction of the precursor at the substrate surface. A slight decomposition, if slow compared to the ALD growth, may be tolerated.

The precursors should chemisorb onto, that is react with, the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The ability to use highly reactive precursors in ALD contrasts with the selection of precursors for conventional CVD type reactions. The by-products in the reaction should be gaseous in order to allow their easy removal from the reaction chamber during a purge stage. Further, the by-products should not react or adsorb on the surface.

In an ALD process, the self-limiting process sequence involves sequential surface chemical reactions. ALD relies on chemistry between a reactive surface and one or more reactive molecular precursors, which are pulsed into the ALD reaction chamber separately. The metal precursor reaction at the substrate is typically followed by an inert gas pulse (e.g., a purge) to remove excess precursor and by-products from the reaction chamber prior to an input pulse of the next precursor of the fabrication sequence. By the use of ALD processes, films can be layered in equal metered sequences that are all identical in chemical kinetics, deposition per cycle, composition, and thickness. ALD sequences generally deposit less than a full layer per cycle, such as a growth rate of from 0.25 to 2.00 Å per cycle.

A cycle of a deposition sequence includes pulsing a first precursor material, pulsing a purging gas for the precursor, pulsing a second reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. The resulting thin layers of different materials, frequently only a few molecular layers thick, may be known as a nanolaminate. A nanolaminate means a composite film of ultra thin layers of two or more different materials in a layered stack, where the layers are alternating layers of the different materials having a thickness on the order of a nanometer and may be a continuous film a single monolayer thick of the material. The nanolayers are not limited to alternating single layers of each material, but may include several layers of one material alternating with a single layer of the other material, to obtain a desired ratio of the two or more materials. If the materials are miscible, the result may be an alloy. Thus a very specific phase change material composition, including desired doping levels, may be obtained, having a uniform thickness with nanometer control levels, and different material layer interfaces a single molecule thick. A PCRAM cell formed using ALD may have accurate control of desired layer thickness, resistance, Tm and other material properties.

Figure 7:
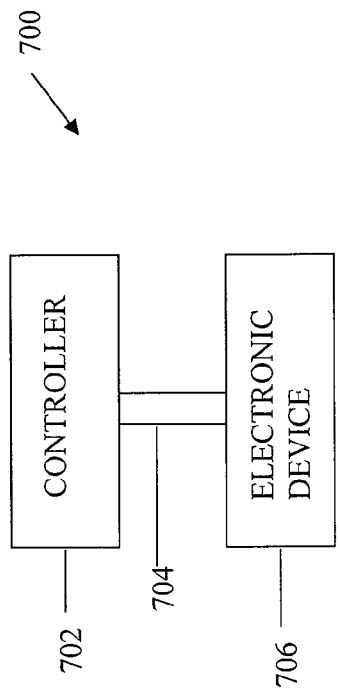
FIG. 7 illustrates a simplified block diagram of a controller coupled to an electronic device formed in accordance with various embodiments.

FIG. 7 illustrates a simplified diagram for an illustrative electronic system 700 having one or more devices including a phase change material layer in a non-volatile memory device according to various disclosed embodiments. The electronic system 700 may include a controller 702, a bus 704, and an electronic device 706, where bus 704 provides electrical conductivity between controller 702 and electronic device 706. In various embodiments, the controller 702 and/or electronic device 706 may include a phase change material layer in a non-volatile memory device as previously discussed herein. Electronic system 700 may include information handling, wireless, telecommunication, fiber optic, automotive, electro-optic, mobile electronics, handheld devices, and computer systems. Electronic device 706 may comprise a microprocessor, a floating point unit, an arithmetic logic unit, a memory device, a multiplexer, an address decoder, a power controller, or any other electronic device used in computer, telecommunication, sensor, display and other products.

Figure 8:
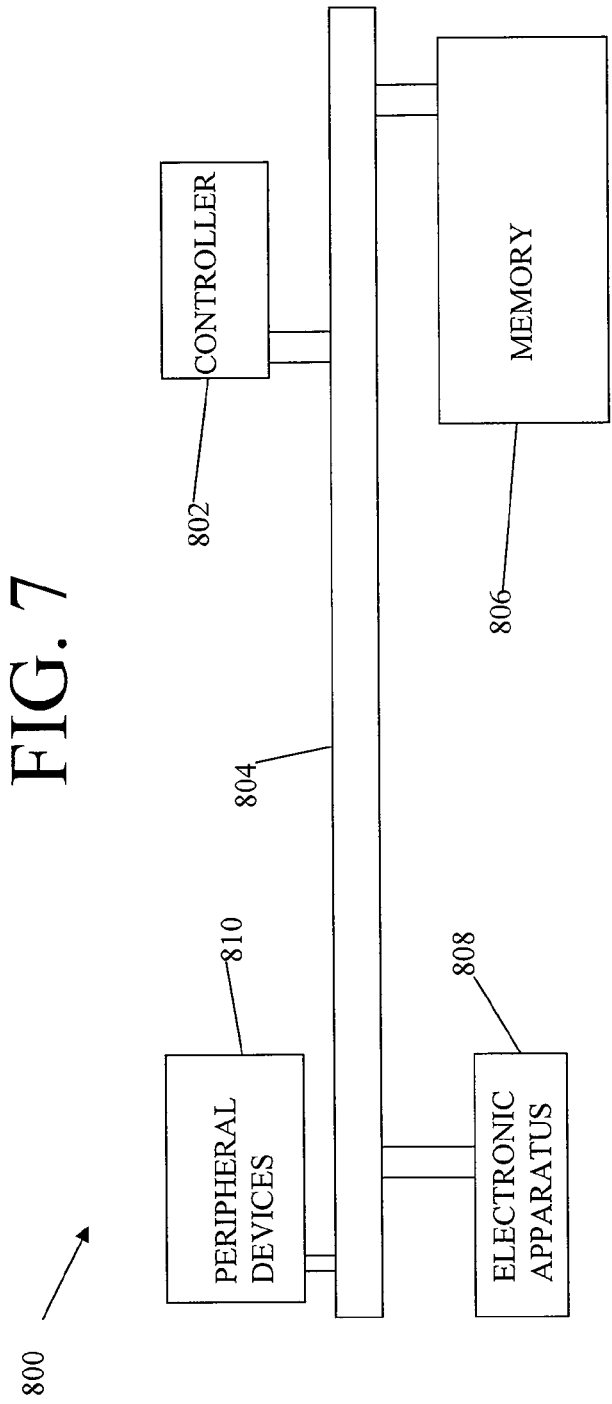
FIG. 8 illustrates an electronic system having devices formed in accordance with various embodiments.

FIG. 8 depicts a diagram of an electronic system 800 having at least one device formed in accordance to the disclosed embodiments, including a controller 802 and a memory 806. Controller 802 and/or memory 806 may include a phase change material layer in a non-volatile memory device. The system 800 may also include an electronic apparatus 808 and a bus 804, where the bus 804 may provide electrical conductivity and data transmission between controller 802 and electronic apparatus 808, and between controller 802 and memory 806. The bus 804 may include an address, a data bus, and a control bus, each independently configured. The bus 804 may use common conductive lines for providing address, data, and/or control, the use of which may be regulated by the controller 802. In some embodiments, the electronic apparatus 808 may include additional memory devices configured similar to the memory 806 with phase change material layers in a non-volatile memory. Some embodiments may include an additional peripheral device 810 coupled to the bus 804. In an embodiment, the controller 802 comprises a processor. Any of the controller 802, the memory 806, the bus 804, the electronic apparatus 808, and peripheral devices 810 may include a phase change material layer in a memory device in accordance with the disclosed embodiments.

System 800 may include, but is not limited to, information handling devices, telecommunication systems, mobile electronic devices such as laptop computers, handheld personal electronic devices such as personal digital assistants (PDA) and palm tops, handheld communication devices such as cell phones, digital cameras and DVD recorders, and computers. Peripheral devices 810 may include displays, additional storage memory, or other control devices that may operate in conjunction with controller 802 and/or memory 806.

Embodiments of the present subject matter may include a method of forming a non-volatile memory, with an electrically conductive bottom electrode in electrical and thermal contact with the bottom surface of a layer of a first phase change material having a first melting temperature and a first glass transition temperature. A second phase change material may be formed on the first phase change material and have a second melting temperature and a second glass transition temperature, and so on for a third, fourth, fifth and sixth phase change material. An electrically conductive top electrode may be formed on the sixth phase change material layer. The first, third, and fifth phase change material layers may be of undoped germanium antimony telluride and have the same melting temperature and glass transition temperature, and the second, fourth, and sixth phase change material layers may be of germanium antimony telluride, each doped with a specified level of nitrogen or oxygen. The undoped germanium antimony telluride layers may have a formula of $Ge_2Sb_2Te_5$, and be formed using atomic layer deposition, physical vapor deposition, chemical vapor deposition, or combinations thereof. The material may have a bandgap of 0.65 to 0.75 eV when amorphous, and between 0.45 to 0.55 eV when crystalline, a conductivity activation energy of greater than 0.30 eV when amorphous, and less than 0.02 eV when crystalline, a glass transition temperature of less than 350° C. and a melting temperature of greater than 600° C., and a sheet resistance of less than 25 mΩ-cm when in a crystalline state and greater than 2500 mΩ-cm when in an amorphous state. The electrically conductive bottom electrode may have a circular cross section, or may have a circular ring cross section, or any other shaped area that is less than one half the area of the top electrode.

Embodiments of the present subject matter may include a method of operating a non-volatile memory by applying a set current to the memory having a current level selected to raise the memory temperature to a level that is below the melting temperature, but above a glass transition temperature of every phase change material layer, and then holding the set current level for a time long enough to crystallize every phase change material layer. Programming the memory is performed by applying a first reset current selected to raise the memory temperature to melt a first phase change material layer, then measuring a first resistance level of the memory by applying a read current less than the first reset current and a set current of any of the layers, and applying read voltage less than the first voltage. To program the memory to a second resistance state includes applying a second reset current higher than the first current and high enough to raise the temperature to melt both a second phase change layer and a first phase change layer, and measuring the resistance, and repeating for the remaining layers. The reset current may be from 0.6 to 1.5 milliamp at a voltage of from 2.5 to 4.5 volts and a time of 10 nanoseconds, the set current may be from 0.2 to 0.5 milliamps at a voltage of from 0.8 to 2.0 volts and a time of 40 nanoseconds, and the read current may be from 0.05 to 5.0 micro amps at a voltage of from 0.05 to 0.5 volts. The set current level may be held for from 40 nanoseconds to 100 nanoseconds to crystallize every one of the phase change material layers.

Embodiments of the present subject matter may include a non-volatile memory device having a bottom electrode, a first layer of an undoped phase change material having a first thickness, a first melting temperature and a first glass transition temperature in contact with the bottom electrode, a second layer of a phase change material having a first doping level, a second thickness, a second melting temperature and a second glass transition temperature in contact with the first layer and so on for a third and fourth layer of phase change materials and a top electrode contact. The first and second doping levels of the second and fourth layers may include oxygen or nitrogen, and the first doping level may be less than the second. The first and third undoped layers may have the same composition and melting temperature, and the bottom electrode may be smaller than the phase change materials.

Alternatively, the memory may have the first through fourth phase change layers arranged in increasing doping level order, and the layer thicknesses may be the same or different. As an example, the first doping level could be zero, the second 2 percent nitrogen, the third doping 4 percent nitrogen, and the fourth 6 percent nitrogen, resulting in an increase in melting temperature. There may also be a fifth layer having a doping level of 8 percent nitrogen and a sixth layer with 10 percent nitrogen to add more logic levels to the memory cell.

Alternatively, the memory may have an increasing doping level from the center layer outward resulting in two layers melting at each temperature phase switch point, except the first center layer melting point. Alternatively the memory may have a decreasing doping level from the center layer outward, or a random placement of different doping levels to obtain various combinations of amorphous layers. The same effect may be obtained by the use of different phase change materials rather than the use of a single phase change material having different doping levels.

The detailed description refers to the accompanying drawings that show, by way of illustration, specific embodiments in which the present disclosed embodiments may be practiced. These embodiments are described in sufficient detail to enable those skilled in the art to practice aspects of the present subject matter. Other embodiments may be utilized, and structural, logical, and electrical changes may be made without departing from the teachings of the disclosed embodiments. The various embodiments are not necessarily mutually exclusive, as some embodiments can be combined with other embodiments to form new embodiments.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present arrangement. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The range of the present disclosed embodiments includes any other applications in which embodiments of the above structures and fabrication methods are used. The detailed description is, therefore, not to be taken in a limiting sense and the extent of the present invention is defined only by the appended claims, along with the full range of equivalents to which such claims are entitled.

What is claimed is:

1. A non-volatile memory device, comprising:
   a bottom electrode;
   a first layer of an undoped phase change material having a first thickness, a first melting temperature and a first glass transition temperature, disposed above and electrically coupled to the bottom electrode;
   a second layer of a phase change material having a first doping level, a second thickness, a second melting temperature and a second glass transition temperature, disposed above and electrically coupled with the first layer;
   a third layer of an undoped phase change material having a third thickness, a third melting temperature and a third glass transition temperature, disposed above and electrically coupled with the second layer;
   a fourth layer of a phase change material having a second doping level, a fourth thickness, a fourth melting temperature and a fourth glass transition temperature, disposed above and electrically coupled with the third layer; and
   a top electrode disposed above and electrically coupled with the fourth layer.

2. The non-volatile memory device of claim 1, wherein the first and second doping levels comprise a selected doping level of at least one of oxygen or nitrogen.

3. The non-volatile memory device of claim 2, wherein the first doping level is less than the second doping level.

4. The non-volatile memory device of claim 1, wherein the first and third undoped layers have the same material composition, and the first and third melting temperature are approximately equal.

5. The non-volatile memory device of claim 1, wherein the bottom electrode has a surface area that is less than half of a surface area of the first phase change material.

6. A memory device, comprising:
   a bottom electrode;
   a first layer of a phase change material having a first doping level, a first thickness, a first melting temperature and a first glass transition temperature, the first layer disposed above and in direct physical contact with the bottom electrode including electrical and thermal contact with the bottom electrode;
   a second layer of a phase change material having a second doping level, a second thickness, a second melting temperature and a second glass transition temperature, the second layer disposed above and in direct physical contact with the first layer including electrical and thermal contact with the first layer;
   a third layer of a phase change material having a third thickness, a third doping level, a third melting temperature and a third glass transition temperature, the third layer disposed above and in direct physical contact with the second layer including electrical and thermal contact with the second layer;
   a fourth layer of a phase change material having a fourth doping level, a fourth thickness, a fourth melting temperature and a fourth glass transition temperature, the fourth layer disposed above and in direct physical contact with the third layer including electrical and thermal contact with the third layer; and
   a top electrode disposed above and in electrical and thermal contact with the fourth layer.

7. The memory device of claim 6, wherein further the first doping level is zero, the second doping level is 2 percent nitrogen, the third doping level is 4 percent nitrogen, the fourth doping level is 6 percent nitrogen.

8. The memory device of claim 6, wherein further the first doping level is lower than the second doping level, the second doping level is lower than the third doping level, and the third doping level is lower than the fourth doping level.

9. The memory device of claim 6, further comprising a fifth layer of a phase change material having a doping level of 8 percent nitrogen, and a sixth layer of a phase change material having a doping level of 10 percent nitrogen.

10. The memory device of claim 6, further comprising a fifth layer of a phase change material having a doping level of 4 percent nitrogen, a sixth layer of a phase change material having a doping level of 2 percent nitrogen, and a seventh layer of a phase change material having a doping level of zero.

11. The memory device of claim 6, wherein the first, second, third, and fourth layers include at least one phase change material selected from the list including germanium telluride (GeTe), indium selenide (InSe), antimony telluride (SbTe), gallium antimonide (GaSb), indium antimonide (InSb), arsenic telluride (AsTe), aluminum telluride (AlTe), germanium antimony telluride (GeSbTe), tellurium germanium arsenide (TeGeAs), indium antimony telluride (InSbTe), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe), tellurium germanium antimony sulfide (TeGeSbS), tellurium germanium tin oxide (TeGeSnO), and alloys of tellurium germanium tin gold, palladium tellurium germanium tin, indium selenium titanium cobalt, germanium antimony tellurium palladium, germanium antimony tellurium cobalt, antimony tellurium bismuth selenium, silver indium antimony tellurium, germanium antimony selenium tellurium, germanium tin antimony tellurium, germanium tellurium tin nickel, germanium tellurium tin palladium, and germanium tellurium tin platinum.

12. The memory device of claim 6, wherein the bottom electrode is disposed in a substrate such that the bottom electrode contacts a diode in the substrate.

13. The memory device of claim 6, wherein the bottom electrode has a circular cross section area in contact with the first layer of phase change material.

14. The memory device of claim 6, wherein the first layer of a phase change material includes $Ge_2Sb_2Te_5$.

15. The non-volatile memory of claim 1, wherein the non-volatile memory includes additional layers of undoped phase change material and doped phase change material arranged in a stack with the first, second, third, and fourth layers such that each layer of undoped phase change material is separated from another layer of undoped phase change material by a layer of doped phase change material.

16. The non-volatile memory of claim 1, wherein the non-volatile memory includes a barrier layer between the first layer of an undoped phase change material and the second layer of a phase change material.

17. The non-volatile memory of claim 16, wherein the barrier layer includes titanium nitride.

18. The non-volatile memory of claim 1, wherein both the first thickness and the third thickness are greater than the second thickness.

19. The non-volatile memory of claim 18, wherein both the first thickness and the third thickness are greater than the fourth thickness.

20. The non-volatile memory of claim 1, wherein the bottom electrode includes a metallic conductor.

* * * * *

UNITED STATES PATENT AND TRADEMARK OFFICE
CERTIFICATE OF CORRECTION

| | | |
|---|---|---|
| PATENT NO. | : 7,897,953 B2 | Page 1 of 1 |
| APPLICATION NO. | : 12/014854 | |
| DATED | : March 1, 2011 | |
| INVENTOR(S) | : Jun Liu | |

It is certified that error appears in the above-identified patent and that said Letters Patent is hereby corrected as shown below:

In column 16, line 63, in Claim 11, delete "(A1Te)," and insert -- (AlTe), --, therefor.

Signed and Sealed this
Nineteenth Day of April, 2011

David J. Kappos
*Director of the United States Patent and Trademark Office*